US012776751B2

(12) United States Patent
Wu et al.

(10) Patent No.: US 12,776,751 B2
(45) Date of Patent: Oct. 27, 2026

(54) AMPLIFIER CIRCUITRY WITH RECONFIGURABLE MATCHING FOR POWER BACKOFF

(71) Applicant: Apple Inc., Cupertino, CA (US)

(72) Inventors: Kefei Wu, San Diego, CA (US); Xiaoqiang Li, San Diego, CA (US); Siwei Li, San Diego, CA (US); Morteza Nick, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/900,275

(22) Filed: Sep. 27, 2024

(65) Prior Publication Data

US 2026/0095130 A1 Apr. 2, 2026

(51) Int. Cl.
*H03F 1/56* (2006.01)
*H03F 3/20* (2006.01)
(Continued)

(52) U.S. Cl.
CPC ............... *H03F 1/565* (2013.01); *H03F 3/20* (2013.01); *H03F 3/602* (2013.01); *H04B 1/40* (2013.01);
(Continued)

(58) Field of Classification Search
CPC . H03F 1/565; H03F 3/20; H03F 3/602; H03F 2200/387; H03F 2200/451; H03F 2200/48; H03F 3/72; H03F 2200/327; H03F 2203/7215; H03F 2200/537; H03F 2200/541; H03F 3/211; H03F 2200/294; H03F 1/0277; H03F 3/19; H03F 2200/312; H03F 3/3028; H03F 3/195; H03F 3/193;
(Continued)

(56) References Cited

U.S. PATENT DOCUMENTS 6,323,733 B1 * 11/2001 Gorcea .................... H03F 3/26
330/276
7,944,296 B1 * 5/2011 Lee ........................ H03F 1/565
330/195
(Continued)

OTHER PUBLICATIONS

U.S. Appl. No. 18/471,536, filed Sep. 21, 2023.
U.S. Appl. No. 18/459,262, filed Aug. 31, 2023.
U.S. Appl. No. 18/470,561, filed Sep. 20, 2023.

*Primary Examiner* — John W Poos
(74) *Attorney, Agent, or Firm* — Treyz Law Group, P.C.; Michael H. Lyons

(57) ABSTRACT

Wireless circuitry may be provided with amplifier circuitry that includes a set of amplifiers on first and second signal lines and matching circuitry that couples the set of amplifiers to an output. The matching circuitry may include a transformer having a primary winding that extends between the signal lines and a secondary winding that extends between the output and a first terminal. The matching circuitry may include first and second capacitors coupled between the signal lines. The amplifier circuitry may be operable in a full power mode and a reduced power mode. The matching circuitry may include a first switch coupled between the first and second capacitors, a second switch that couples the first terminal to ground, and a third switch that couples a second terminal on the secondary winding to ground. The first, second, and third switches may be adjusted between the full and reduced power modes.

20 Claims, 8 Drawing Sheets

(51) Int. Cl.
*H03F 3/60* (2006.01)
*H04B 1/40* (2015.01)

(52) U.S. Cl.
CPC .. *H03F 2200/387* (2013.01); *H03F 2200/451* (2013.01); *H03F 2200/48* (2013.01)

(58) Field of Classification Search
CPC . H03F 3/24; H03F 3/245; H03F 3/189; H03F 3/217; H03F 3/62; H03F 1/0211; H03F 1/223; H03F 1/56; H03F 2200/111; H03F 2200/534; H03F 3/2173; H03F 3/26; H03F 3/3091; H03F 3/68; H03F 1/0205; H03F 1/0233; H03F 1/0244; H03F 1/16; H03F 2200/03; H03F 2200/114; H03F 2200/18; H03F 2200/366; H03F 2200/372; H03F 2203/45731; H03F 3/2171; H03F 3/2175; H03F 3/2178; H03F 3/3081; H03F 3/393; H03F 3/45179; H03F 3/45475; H04B 1/40; H04B 1/16; H04B 1/0458; H04B 1/44; H04B 1/48; H04B 2001/0408; H04B 1/18; H04B 1/3833; H04B 1/401; H04B 7/0617; H04B 7/0691; H04B 7/0874; H04B 1/04; H04B 1/123; H04B 1/525; H04B 1/7174; H04B 2201/71634; H04B 7/0802; H03K 7/02; H03K 17/6221; H03K 17/68; H03K 17/687; H03K 3/013; H03K 3/313; H03K 3/352; H03K 3/354; H03K 4/92; H03K 5/02; H03K 5/135; H03K 5/159; H03H 2250/00; H03H 7/0153; H03H 7/06; H03H 7/1775; H03H 7/42; H03H 11/16; H03H 7/20; H03H 7/18; H03H 7/38; H03H 2/008
See application file for complete search history.

(56) References Cited

U.S. PATENT DOCUMENTS

| | | | |
|---|---|---|---|
| 8,390,391 | B2 | 3/2013 | Frye et al. |
| 8,983,398 | B2 * | 3/2015 | Chang .................... H04B 1/406 455/275 |
| 10,256,783 | B2 * | 4/2019 | Chu .................... H03F 3/45188 |
| 10,333,579 | B1 * | 6/2019 | Emira .................. H03K 17/081 |
| 11,152,905 | B2 | 10/2021 | Hu et al. |
| 11,265,038 | B1 | 3/2022 | Muharemovic et al. |
| 11,881,715 | B2 | 1/2024 | Wang et al. |
| 2017/0250728 | A1 * | 8/2017 | Afsahi ..................... H04B 1/44 |
| 2024/0063758 | A1 | 2/2024 | Singhal et al. |
| 2024/0250709 | A1 | 7/2024 | Abdelatty et al. |
| 2024/0322795 | A1 * | 9/2024 | Hassan .................. H03H 11/16 |

* cited by examiner

AMPLIFIER CIRCUITRY WITH RECONFIGURABLE MATCHING FOR POWER BACKOFF

FIELD

This disclosure relates generally to electronic devices, including electronic devices with wireless communications circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals conveyed by an antenna are often fed through power amplifier circuitry. It can be challenging to design satisfactory power amplifier circuitry for an electronic device. For example, if care is not taken, the power amplifier circuitry might not exhibit sufficient levels of performance across its range of operating powers.

SUMMARY

An electronic device may be provided with wireless circuitry. The wireless circuitry may include amplifier circuitry. The amplifier circuitry may include a set of amplifiers disposed on a differential signal path. The amplifier circuitry may include matching circuitry that couples an output of the set of amplifiers to an output of the amplifier circuitry. The matching circuitry may include a first and second series capacitors on first and second signal lines of the differential signal path. The matching circuitry may include a transformer that couples the differential signal path to the output of the amplifier circuitry. The transformer may include a primary winding extend between first and second terminals coupled to the first and second signal lines. The transformer may include a secondary winding that extends between the output of the amplifier circuitry and a third terminal. The matching circuitry may include third and fourth capacitors coupled between the first and second signal lines.

The amplifier circuitry may be operable in at least a full power mode and a reduced power mode. In the full power mode, all of the amplifiers in the set of amplifiers are active. In the reduced power mode, a subset of the set of amplifiers may be inactive. The matching circuitry may include switching circuitry that is adjusted between the full and reduced power modes. The switching circuitry may include a first switch coupled in series between the third and fourth capacitors. The switching circuitry may include a second switch that couples the third terminal to a reference potential. The switching circuitry may include a third switch that couples a fourth terminal between the third terminal and a center of the secondary winding to the reference potential. In the full power mode, the third switch may be closed and the first and second switches may be open. In the reduced power mode, the third switch may be open and the first and second switches may be closed. This may help to improve the power added efficiency and linearity of the amplifier circuitry when operating in the reduced power mode.

An aspect of the disclosure provides amplifier circuitry. The amplifier circuitry can include a transformer that includes a primary winding and a secondary winding, the secondary winding extending from a first terminal to a second terminal and having a center point halfway between the first and second terminals. The amplifier circuitry can include first and second amplifiers coupled in parallel between an input port of the amplifier circuitry and the transformer. The amplifier circuitry can include a first switch that couples the second terminal to a reference potential. The amplifier circuitry can include a second switch that couples, to the reference potential, a third terminal on the secondary winding, the third terminal being between the center point and the second terminal.

An aspect of the disclosure provides amplifier circuitry. The amplifier circuitry can include a differential signal path that includes a first signal line and a second signal line. The amplifier circuitry can include a first amplifier on the first signal line. The amplifier circuitry can include a second amplifier on the second signal line. The amplifier circuitry can include a transformer having a primary winding extending from a first terminal to a second terminal and having a secondary winding extending from a third terminal to a fourth terminal, the first terminal being coupled to the first signal line and the second terminal being couple to the second signal line. The amplifier circuitry can include a first capacitor coupled to a first node on the first signal line between the first amplifier and the first terminal. The amplifier circuitry can include a second capacitor coupled to a second node on the second signal line between the second amplifier and the second terminal. The amplifier circuitry can include a first switch coupled in series between the first and second capacitors.

An aspect of the disclosure provides wireless circuitry. The wireless circuitry can include an antenna. The wireless circuitry can include power amplifier circuitry having an output terminal communicatively coupled to the antenna. The power amplifier circuitry can include a differential signal path having first and second signal lines. The power amplifier circuitry can include a set of amplifiers on the differential signal path. The power amplifier circuitry can include a transformer having a primary winding coupled between the first and second signal lines and having a secondary winding coupled to the output terminal. The power amplifier circuitry can include first and second switches coupled between the secondary winding and a reference potential and configured to adjust a turn ratio of the transformer. The power amplifier circuitry can include a pair of capacitors coupled between the first and second signal lines. The power amplifier circuitry can include a third switch coupled between the pair of capacitors.

DETAILED DESCRIPTION

Figure 1:
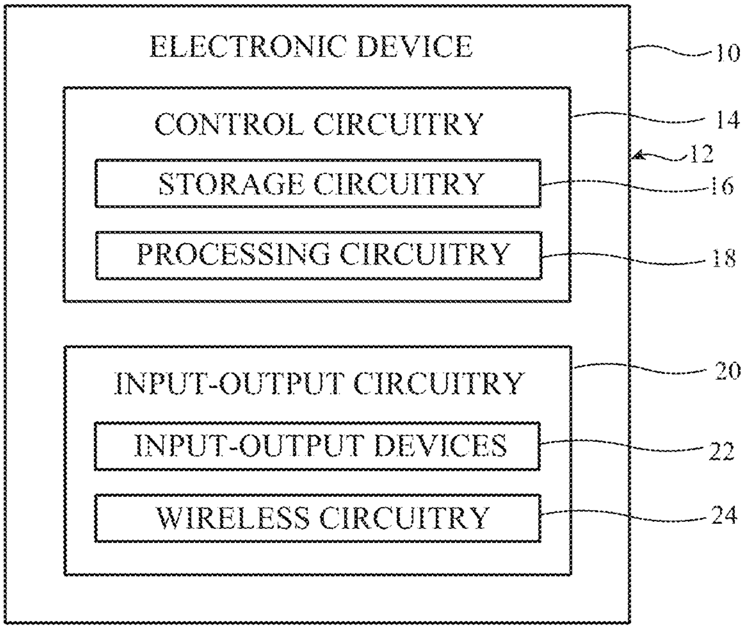
FIG. 1 is a diagram of an illustrative electronic device having wireless circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses, goggles, a helmet, or other equipment worn on a user's head (e.g., an augmented, virtual, or mixed reality head-mounted display device), or another wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors such as microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), a Wi-Fi® 7 band, and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, sub-THz frequency bands between around 100 GHz and 10 THz (e.g., 6G bands), near-field communications (NFC) frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
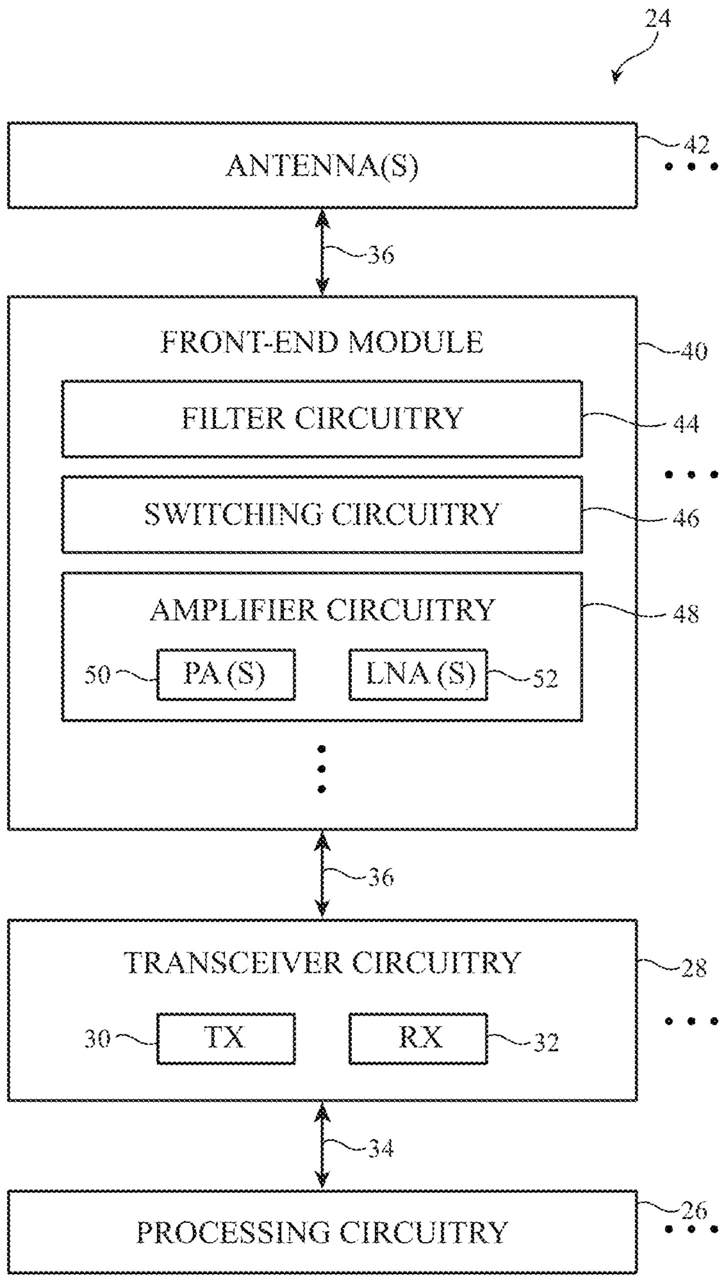
FIG. 2 is a diagram of illustrative wireless circuitry that includes amplifier circuitry in accordance with some embodiments.

FIG. 2 is a diagram showing illustrative components within wireless circuitry 24. As shown in FIG. 2, wireless circuitry 24 may include processing circuitry such as processing circuitry 26, radio-frequency (RF) transceiver circuitry such as radio-frequency transceiver 28, radio-frequency front-end circuitry such as radio-frequency front-end module (FEM) 40, and antenna(s) 42. Processing circuitry 26 may be coupled to transceiver 28 over baseband path 34. Transceiver 28 may be coupled to antenna 42 via radio-frequency transmission line path 36. Radio-frequency front-end module 40 may be disposed on radio-frequency transmission line path 36 between transceiver 28 and antenna 42.

In the example of FIG. 2, wireless circuitry 24 is illustrated as including only a single transceiver 28, a single front-end module 40, and a single antenna 42 for the sake of clarity. In general, wireless circuitry 24 may include any desired number of transceivers 28, any desired number of front-end modules 40, and any desired number of antennas 42. If desired, processing circuitry 26 may include different processing units (e.g., processors) coupled to one or more transceiver 28 over respective baseband paths 34. Each transceiver 28 may include a transmitter (TX) circuit 30 configured to output uplink signals to antenna 42, may include a receiver (RX) circuit 32 configured to receive downlink signals from antenna 42, and may be coupled to one or more antennas 42 over respective radio-frequency transmission line paths 36. Each radio-frequency transmission line path 36 may have a respective front-end module 40 disposed thereon. If desired, two or more front-end modules 40 may be disposed on the same radio-frequency transmission line path 36. If desired, one or more of the radio-frequency transmission line paths 36 in wireless circuitry 24 may be implemented without any front-end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled strip-line transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processing circuitry 26 may provide baseband signals to transceiver 28 over baseband path 34. Transceiver 28 may further include circuitry for converting the baseband signals received from processing circuitry 26 into corresponding radio-frequency signals. For example, transceiver circuitry 28 may include mixer circuitry for up-converting (or modulating) the baseband signals to radio-frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front-end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front-end module 40. Transceiver 28 may include circuitry such as receiver (RX) 32 for receiving signals from front-end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processing circuitry 26 over baseband path 34.

Front-end module (FEM) 40 may include radio-frequency front-end circuitry that operates on the radio-frequency signals conveyed (transmitted and/or received) over radio-frequency transmission line path 36. FEM 40 may, for example, include front-end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front-end module components may be mounted to a common (shared) substrate such as a rigid printed circuit board substrate or flexible printed circuit substrate. If desired, the various front-end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front-end module 40. For example, transceiver 28 may be formed on another substrate such as the main logic board of device 10, a rigid printed circuit board, or flexible printed circuit that is not a part of front-end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processing circuitry 26 and/or portions of transceiver 28 (e.g., a host processor on transceiver 28) may form a part of control circuitry 14. Control circuitry 14 (e.g., portions of control circuitry 14 formed on processing circuitry 26, portions of control circuitry 14 formed on transceiver 28, and/or portions of control circuitry 14 that are separate from wireless circuitry 24) may provide control signals (e.g., over one or more control paths in device 10) that control the operation of front-end module 40.

Transceiver 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), a Wi-Fi® 7 band, wireless personal area network (WPAN) transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, 6G bands above 100 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front-end module 40 may include one or more power amplifiers (PA) circuits 50 in the transmit (uplink) path. A power amplifier 50 (sometimes referred to as radio-frequency power amplifier circuitry, transmit amplifier circuitry, or amplifier circuitry) may be configured to amplify a radio-frequency signal without changing the signal shape, format, or modulation. Power amplifier 50 may, for example, be used to provide 10 dB of gain, 20 dB of gain, 10-20 dB of gain, less than 20 dB of gain, more than 20 dB of gain, or other suitable amounts of gain.

Figure 3:
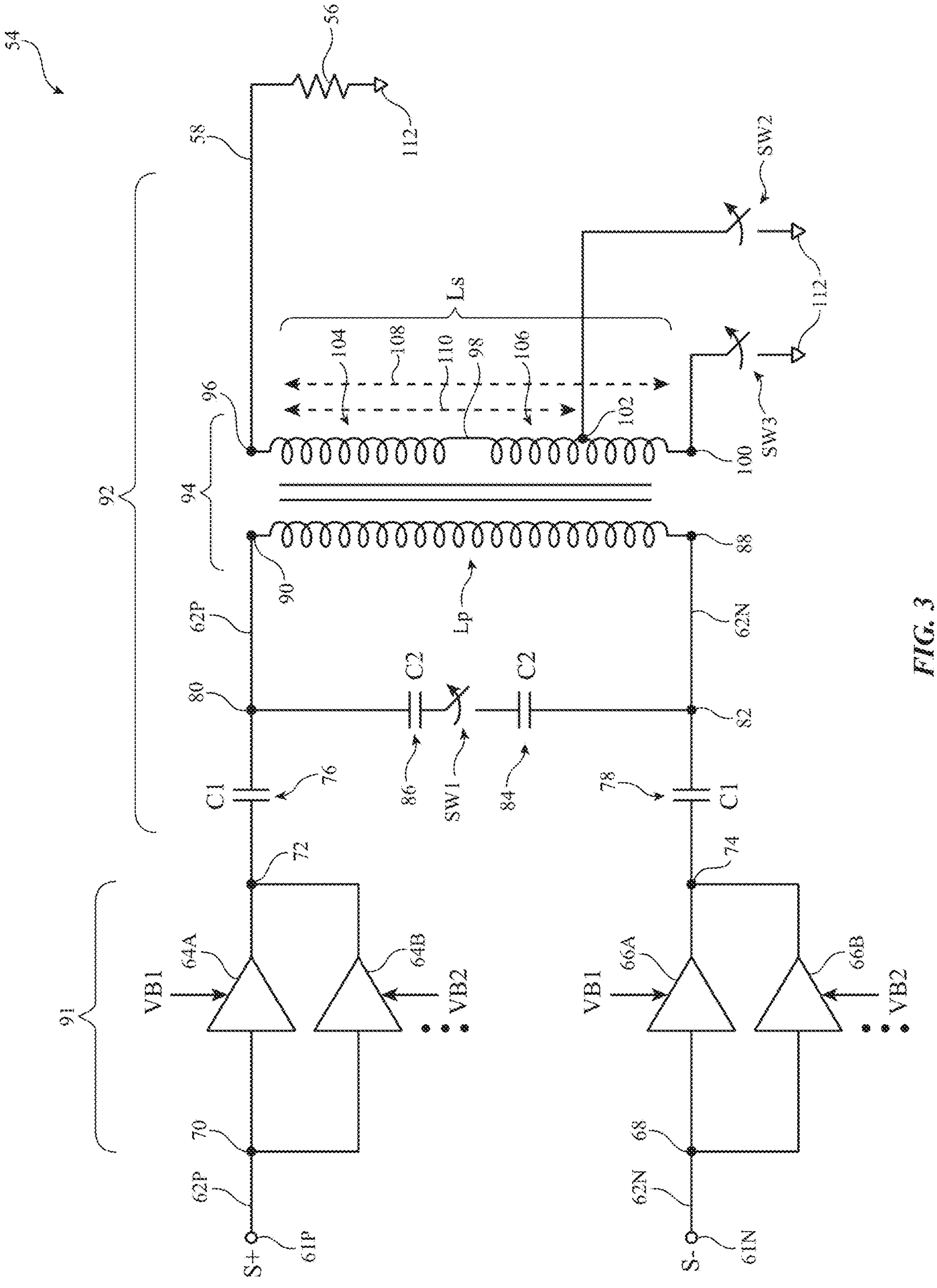
FIG. 3 is a circuit diagram of illustrative amplifier circuitry that includes reconfigurable matching circuitry in accordance with some embodiments.

FIG. 3 is a circuit diagram of illustrative amplifier circuitry 54 that may be included in wireless circuitry 24. Amplifier circuitry 54 of FIG. 3 may, for example, form a PA 50 in front end module 40, a PA in transceiver 28, an LNA 52 in front end module 40, an LNA in transceiver 28, or any other desired radio-frequency amplifier elsewhere in wireless circuitry 24. Implementations in which amplifier circuitry 54 forms a power amplifier or power amplifier circuitry in wireless circuitry 24 are described herein as a non-limiting example. Amplifier circuitry 54 is therefore sometimes referred to herein as power amplifier circuitry 54 or simply as power amplifier 54. Amplifier circuitry 54 may be implemented in wired (e.g., non-wireless) communications circuitry on device 10 if desired.

As shown in FIG. 3, amplifier circuitry 54 may have an input port 61 coupled to an input signal path. In the example of FIG. 3, the input signal path is a differential signal path. As such, input port 61 may be a differential input port. The differential input port may include a first (positive) input terminal 61P coupled to a first (positive) signal line in the input signal path and may include a second (negative) input terminal 61N coupled to a second (negative) signal line in the input signal path. Input terminals 61P and 61N may form a differential pair of input terminals. Amplifier circuitry 54 may include a differential signal path 62 that includes a first (positive) signal line 62P coupled to input terminal 61P and a second (negative) signal line 62N coupled to input terminal 61N. Alternatively, input port 61 may be a single-ended input port and differential signal path 62 may be replaced with a single-ended signal path (e.g., signal path 62N and its components may be omitted from amplifier circuitry 54).

Amplifier circuitry 54 may have an output port (terminal) coupled to output signal path 58. Output signal path 58 is illustrated as a single-ended signal path in this example but may, if desired, be a differential signal path. Output signal path 58 may couple amplifier circuitry 54 to an output load such as load 56. The input signal path coupled to input terminals 61P and 61N, signal lines 62P and 62N, and output signal path 58 may collectively form part of a radio-frequency transmission line path 36 (FIG. 2) coupled to load 56. Load 56 may be, for example, an antenna 42 (FIG. 2), other circuitry in a transmit chain coupled to an antenna 42, or any other desired load in device 10.

Amplifier circuitry 54 may include gain circuitry 91 disposed on differential signal path 62. The input of gain circuitry 91 may be communicatively coupled to input terminals 61P and 61N. Amplifier circuitry 54 may also include impedance matching circuitry. The impedance matching circuitry may include output impedance matching circuitry disposed on differential signal path 62 such as output matching circuitry 92. Output matching circuitry 92 may couple the output of gain circuitry 91 to output signal path 58. Output matching circuitry 92 may serve to match the output impedance of gain circuitry 91 to the impedance of load 56. Amplifier circuitry 54 may also include input matching circuitry (not shown) coupled to the input of gain circuitry 91. Output matching circuitry 92 is sometimes also referred to herein as output matching network 92, impedance matching circuitry 92, output impedance matching circuitry 92, impedance matching network 92, or output impedance matching circuitry 92. Output matching circuitry 92 includes switching circuitry that reconfigures or adjusts output matching circuitry 92 over time. As such, output matching circuitry 92 is sometimes also referred to herein as reconfigurable output matching circuitry 92, reconfigurable output matching network 92, reconfigurable matching circuitry 92, or reconfigurable matching network 92.

Gain circuitry 91 may include a set of two or more amplifiers 64 coupled in parallel on signal line 62P between input terminal 61P and output matching circuitry 92. Each amplifier 64 may be the same size and the same type of amplifier or, if desired, different amplifiers 64 may have different sizes and/or may be different types of amplifiers. If desired, different amplifiers 64 may operate under different biasing conditions, with different gains, over different input and/or output power levels, with different linearity conditions, etc. FIG. 3 illustrates a simplest case in which gain circuitry 91 includes a first amplifier 64A and a second amplifier 64B. This may be generalized to any desired number of amplifiers 64. Amplifiers 64 are sometimes also referred to herein as amplifier units 64 (e.g., power amplifier units) or amplifier cells 64 of amplifier circuitry 54.

As shown in FIG. 3, the input of each amplifier 64 may be coupled to a node 70 on signal line 62P between input terminal 61P and amplifiers 64. If desired, signal line 62P may include a signal splitter or signal coupler at node 70 that splits a signal received over input terminal 61P between each amplifier 64. The output of each amplifier 64 may be coupled to a node 72 on signal line 62P between amplifiers 64 and output matching circuitry 92 (e.g., amplifiers 64 may be coupled in parallel between nodes 70 and 72). If desired, signal line 62P may include a signal combiner or signal coupler at node 72 that combines signals output by amplifiers 64 together on signal line 62P.

Similarly, gain circuitry 91 may include a set of two or more amplifiers 66 coupled in parallel on signal line 62N between input terminal 61N and output matching circuitry 92. Each amplifier 66 may be the same size and the same type of amplifier or, if desired, different amplifiers 66 may have different sizes and/or may be different types of amplifiers. If desired, different amplifiers 66 may operate under different biasing conditions, with different gains, over different input and/or output power levels, with different linearity conditions, etc. FIG. 3 illustrates a simplest case in which gain circuitry 91 includes a first amplifier 66A and a second amplifier 66B. This may be generalized to any desired number of amplifiers 66. Amplifiers 66 are sometimes also referred to herein as amplifier units 66 (e.g., power amplifier units) or amplifier cells 66 of amplifier circuitry 54.

As shown in FIG. 3, the input of each amplifier 66 may be coupled to a node 68 on signal line 62N between input terminal 61N and amplifiers 64. If desired, signal line 62P may include a signal splitter or signal coupler at node 68 that splits a signal received over input terminal 61N between each amplifier 66. The output of each amplifier 66 may be coupled to a node 74 on signal line 62N between amplifiers 64 and output matching circuitry 92 (e.g., amplifiers 66 may be coupled in parallel between nodes 68 and 74). If desired, signal line 62N may include a signal combiner or signal coupler at node 74 that combines signals output by amplifiers 66 together on signal line 62N. In the example of FIG. 3, gain circuitry 91 includes only a single stage of amplifiers 64 and amplifiers 66. This is illustrative and non-limiting. If desired, gain circuitry 91 may include two or more stages of amplifiers 64 coupled between nodes 70 and 72 and/or may include two or more stages of amplifiers 66 coupled between nodes 68 and 74. If desired, inter-stage matching circuitry may be coupled between each of the stages.

Output matching circuitry 92 may include transformer circuitry such as transformer 94. Transformer 94 may couple differential signal path 62 to output signal path 58. Transformer 94 may include a first (primary) winding Lp extending from a first terminal 90 of transformer 94 to a second terminal 88 of transformer 94. Terminal 90 of primary winding Lp may be coupled to signal line 62P. Terminal 88 of primary winding Lp may be coupled to signal line 62N (e.g., signal line 62P may be coupled to signal line 62N through primary winding Lp). Transformer 94 may also include a second (secondary) winding Ls extending from a third terminal 96 of transformer 94 to a fourth terminal 100 of transformer 94. Terminal 96 of secondary winding Ls may be coupled to output signal path 58 and may form an output terminal or port of amplifier circuitry 54. Terminal 100 of secondary winding Ls may be communicatively coupled to a reference potential such as ground 112 (e.g., transformer 94 may form a balun that converts a differential signal on differential signal path 62 into a single-ended signal on output signal path 58). Secondary winding Ls may be electromagnetically coupled to primary winding Lp. The coupling may be characterized by a corresponding non-zero coupling coefficient k.

Input matching circuitry 92 may further include capacitors such as capacitors 76, 78, 86, and 84. Capacitor 76 may be disposed on signal line 62P and may be coupled in series between node 72 and terminal 90 of transformer 94. Capacitor 78 may be disposed on signal line 62N and may be coupled in series between node 74 and terminal 88 of transformer 94. Capacitors 78 and 76 may each have a first capacitance C1.

Capacitors 86 and 84 may be coupled in series between node 80 on signal line 62P and node 82 on signal line 62N. Node 80 may be between capacitor 76 and terminal 90 on signal line 62P. Node 82 may be between capacitor 78 and terminal 88 on signal line 62N. Capacitors 86 and 84 may each have capacitance C2. Capacitance C2 may be different than capacitance C1 or may be the same as capacitance C1. Alternatively, capacitor 86 may have a different capacitance than capacitor 84.

Secondary winding Ls of transformer 94 may include a first portion 104 and a second portion 106 coupled in series between terminals 96 and 100. First portion 104 may include a first set of turns (coils or loops) of secondary winding Ls.

The first set of turns may include between one-quarter and one, one, or more than one turn of secondary winding Ls. Second portion 106 may include a second set of turns (coils or loops) of secondary winding Ls. The second set of turns may include between one-quarter and one, one, or more than one turn of secondary winding Ls. If desired, a conductive structure such as conductor 98 may couple first portion 104 of secondary winding Ls to second portion 106 of secondary winding Ls. Second portion 106 may have the same overall length as first portion 104 (e.g., the same number of turns) or, if desired, second portion 106 may have a different length than first portion 104 (e.g., a different number of turns). The central point along the length of secondary winding Ls (e.g., between terminals 96 and 100) may be at the center of conductor 98.

Output matching circuitry 92 may include switching circuitry that adjusts or reconfigures the impedance of output matching circuitry 92 over time. For example, output matching circuitry 92 may include at least a first switch SW1, a second switch S2, and a third switch SW3 (e.g., single-pole single-throw (SPST) switches). Switch SW1 may be coupled in series between capacitors 86 and 84. Switch SW3 may couple terminal 100 of transformer 94 to a reference potential such as ground 112 (e.g., terminal 100 may be switchably coupled to ground 112 by switch SW3). Switch SW2 may couple a terminal 102 along the length of second portion 106 of secondary winding Ls to ground 112 (e.g., terminal 102 may be switchably coupled to ground 112 by switch SW2). Terminal 102 may be located halfway along the length of second portion 106 or may be located at other positions along second portion 106 of secondary winding Ls. Terminal 102 is not coupled to a center tap of secondary winding Ls and is not a center tap terminal of secondary winding Ls. On the other hand, terminal 102 is coupled to a location on secondary winding Ls other than the center or halfway point between terminals 96 and 100. Terminal 102 may, for example, be coupled to secondary winding Ls at a location that is between the center tap, center point, or halfway point of secondary winding Ls and terminal 100. Terminal 102 is sometimes also referred to herein as non-center-tap terminal 102. Switch SW1 may selectively switch capacitors 86 and 84 into or out of use over time. Switches SW2 and SW3 may adjust the effective length of secondary winding Ls and thus the turn ratio between primary winding Lp and secondary winding Ls and the corresponding impedance of transformer 94 over time.

Amplifier circuitry 54 may be operable in a set of two or more different power modes. Amplifier circuitry 54 may, for example, be operable in at least a full power mode and a reduced power mode. When operating in the full power mode, amplifier circuitry 54 may output radio-frequency signals onto output signal path 58 (e.g., driving load 56) at output power levels up to a first maximum output power level equal to the maximum output power level of amplifier circuitry 54. When operating in the reduced power mode, amplifier circuitry 54 may output radio-frequency signals onto output signal path 58 at output power levels up to a second (reduced) maximum output power level that is less than the first maximum output power level.

In the full power mode, amplifiers 64A, 64B, 66A, and 66B are active, turned on, or enabled. Amplifiers 64A and 66A may amplify signals on signal lines 62P and 62N using a first bias voltage VB1. Amplifiers 64B and 66B may amplify signals on signal lines 62P and 62N using a second bias voltage VB2. Bias voltage VB2 may be different than bias voltage VB1 or may be the same as bias voltage VB1. Output matching circuit 92 may pass the amplified signal from differential signal path 62 onto output signal path 58 while also matching the output impedance of gain circuitry 91 to the impedance of load 56.

In the reduced power mode, amplifiers 64A and 66A are active and amplifiers 64B and 66B are inactive, turned off, or disabled. Amplifiers 64B and 66B may be turned off, deactivated, or disabled (e.g., when or upon entering the reduced power mode) by reducing bias voltage VB2 to a magnitude of zero volts or by decoupling bias voltage VB2 from amplifiers 64B and 66B (e.g., using switching circuitry between gain circuitry 92 and power supply circuitry), as two examples. When turned off, current does not pass from the input to the output of amplifiers 64B and 66B, and amplifiers 64B and 66B do not amplify signals on differential signal path 62 (e.g., only amplifiers 64A and 66A amplify the signals in the reduced power mode). This configures gain circuitry 92 to output amplified signals to transformer 94 at lower peak output power levels than when operated in the full power mode.

In practice, disabling amplifiers 64B and 66B when entering the reduced power mode adjusts the output impedance of gain circuitry 91. If care is not taken, this can undesirably deteriorate the power added efficiency (PAE) of amplifier circuitry 54 (e.g., reducing battery life for device 10) and/or can undesirably deteriorate the linearity of amplifier circuitry 54 (e.g., reducing the quality of the signal output by amplifier circuitry 54). To mitigate these issues, control circuitry 14 (FIG. 1) may adjust switches SW1, SW2, and SW3 when switching amplifier circuitry 54 between full power and reduced power modes.

In general, switches SW1, SW2, and SW3 may be implemented using any desired switching circuits or components. In a simplest (but non-limiting) example, switch SW1 may be implemented using a first transistor having source-drain terminals coupled to capacitors 86 and 84, switch SW2 may be implemented using a second transistor having source-drain terminals coupled to terminal 102 and ground 112, and switch SW3 may be implemented using a third transistor having source-drain terminals coupled to terminal 100 and ground 112. The terms "source" and "drain" terminals used to refer to current-conveying terminals in a transistor may be used interchangeably and are sometimes referred to as "source-drain" terminals. Thus, the source terminal of the first transistor can thus sometimes be referred to as a first source-drain terminal, and the drain terminal of the first transistor can be referred to as a second source-drain terminal (or vice versa). Switch control voltages may be applied to gate terminals of the first, second, and third transistors to control the switch state of switches SW1, SW2, and SW3 respectively (e.g., to activate or deactivate the switches).

The term "activate" with respect to a switch (or transistor) may refer to or be defined herein as an action that places the switch in an "on" or low-impedance state such that the two source-drain terminals of the switch are electrically connected to conduct current. Activating a switch can sometimes be referred to as turning on, enabling, or closing a switch (e.g., an active switch is sometimes also referred to herein as an on switch, an enabled switch, or a closed switch). The term "deactivate" with respect to a switch (or transistor) may refer to or be defined herein as an action that places the switch in an "off" or high-impedance state such that the two source-drain terminals of the switch/transistor are electrically disconnected with minimal leakage current. Deactivating a switch can sometimes be referred to as turning off, disabling, or opening a switch (e.g., a deactivated switch is sometimes also referred to herein as an off switch, a disabled switch, or an open switch).

In the full power mode, switch SW1 may be open. This forms an open circuit impedance between capacitors 86 and 84 and thus between node 80 on signal line 62P and node 82 on signal line 62N, removing capacitors 86 and 84 from contributing to the impedance matching performed by output matching network 92. At the same time, in the full power mode, switch SW2 may be open and switch SW3 may be closed (e.g., forming a short circuit impedance from terminal 100 of secondary winding Ls to ground 112). This causes the entire length 108 of secondary winding Ls, including first portion 104 and the entirety of second portion 106, to electromagnetically couple to primary winding Lp. Put differently, this causes the entirety of secondary winding Ls to contribute to the turn ratio of transformer 94, causing transformer 94 to exhibit a first impedance (e.g., a full power mode impedance that matches the output impedance of all of the amplifiers in gain circuitry 91 to the impedance of load 56 while amplifier circuitry 54 is in the full power mode). Capacitors 76 and 78 and transformer 94 (e.g., primary winding Lp and the entirety of secondary winding Ls) may perform output impedance matching for amplifier circuitry 54 in the full power mode.

On the other hand, in the reduced power mode, switch SW3 may be open and switch SW2 may be closed (e.g., forming an open circuit impedance between terminal 100 and ground 112 and forming a short circuit impedance between terminal 102 and ground 112 through switch SW2). This effectively reduces the length of secondary winding Ls to length 110, including first portion 104 and a subset of second portion 106 extending from conductor 98 to terminal 102. As such, only length 110 of secondary winding Ls will electromagnetically couple to primary winding Lp with a non-zero coupling coefficient (whereas the remaining length of secondary winding Ls between terminal 102 and terminal 100 is switched out of use and does not electromagnetically couple to primary winding Lp with a non-zero coupling coefficient).

Put differently, this may effectively change the turn ratio of transformer 94 (e.g., because only length 110 of secondary winding Ls contributes to the turn ratio of transformer 94), causing transformer 94 to exhibit a second impedance that is different from the first impedance (e.g., a reduced power mode impedance that matches the output impedance of the active amplifiers in gain circuitry 91 to the impedance of load 56 while amplifier circuitry 54 is in the reduced power mode). Reducing the length of secondary winding Ls in this way may, for example, effectively increase the turn ration of transformer 94, which increases the impedance seen by gain circuitry 91 to boost PAE and linearity for amplifier circuitry 54. Because the load impedance is higher than the parasitic resistance of switches SW1, SW2, and SW3, switches SW1, SW2, and SW3 may reconfigure output matching network 92 based on the present operating mode of amplifier circuitry 54 without introducing excessive insertion loss to the amplified signal.

At the same time, in the reduced power mode, switch SW1 may be closed (e.g., forming a short circuit impedance between capacitors 86 and 84). This may couple capacitors 86 and 84 into use between node 80 on signal line 62P and node 82 on signal line 62N (e.g., coupling a capacitance equal to C2/2 between nodes 80 and 82), which may further increase the impedance seen by gain circuitry 91 (e.g., in addition to the adjustment produced by shortening the length of secondary winding Ls in transformer 94). This may serve to further boost the PAE and linearity of amplifier circuitry 54 in the reduced power mode.

Figure 4:
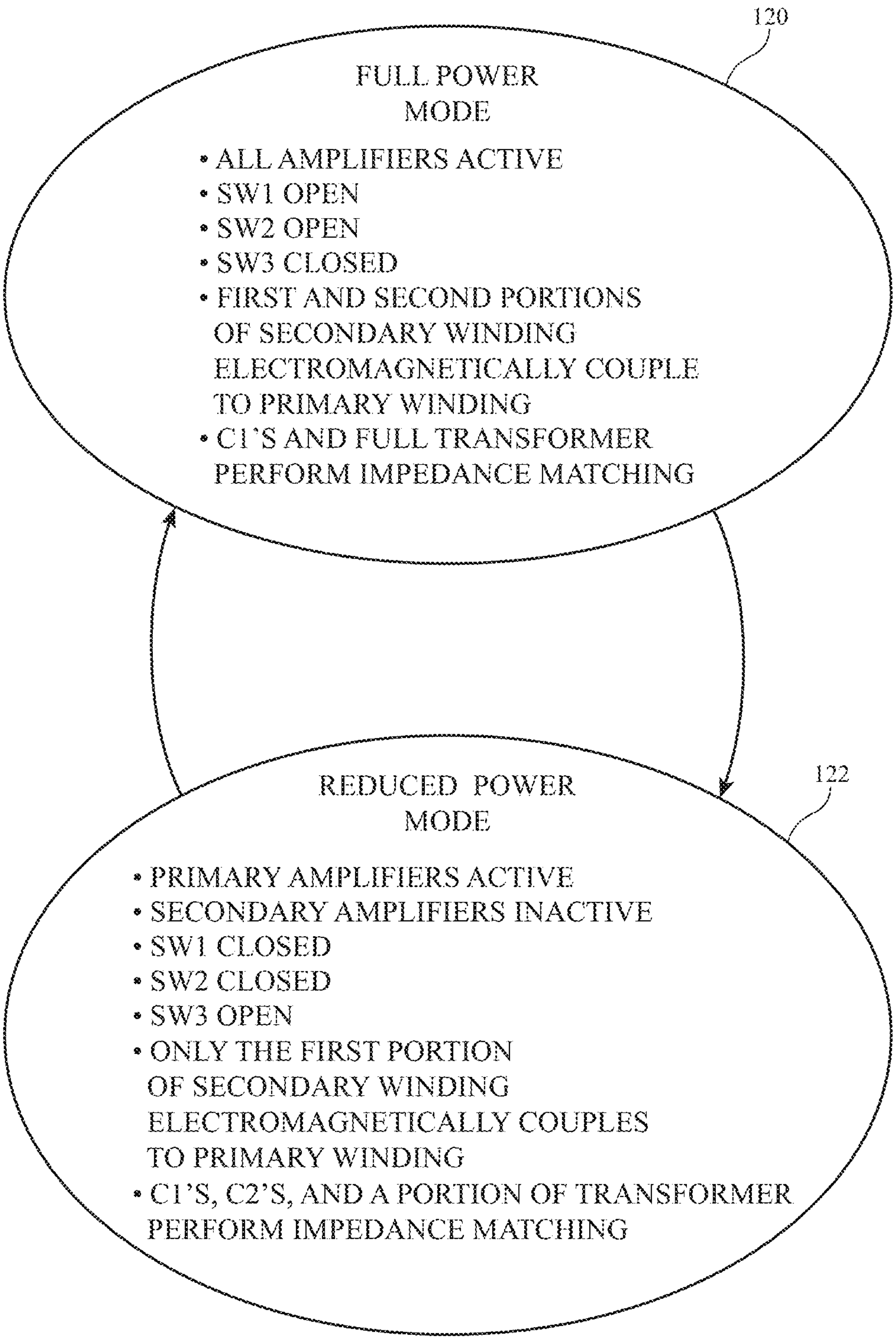
FIG. 4 is an illustrative state diagram showing how amplifier circuitry of the type shown in FIG. 3 may be operable in full and reduced power modes in accordance with some embodiments.

FIG. 4 is a state diagram showing how amplifier circuitry 54 may be switched between a full power mode 120 and a reduced power mode 122. Control circuitry 14 (FIG. 1) may, for example, place amplifier circuitry 54 in full power mode 120 whenever maximum signal/communications quality is needed. Control circuitry 14 may switch amplifier circuitry 54 from full power mode 120 to reduced power mode 122 in response to any desired trigger condition (e.g., when reducing the maximum output power level of amplifier circuitry 54 will not significantly deteriorate wireless performance such as when communicating with another device that is nearby to device 10, to conserve battery power, to satisfy regulatory requirements on electromagnetic absorption or exposure, etc.). Control circuitry 14 may switch amplifier circuitry 54 from reduced power mode 122 back to full power mode 120 in response to any desired trigger condition (e.g., when communicating with an external device that is far away, when boosted communications quality is needed, when beginning a communications session, etc.).

In full power mode 120, all of the amplifiers 64 and all of the amplifiers 66 in amplifier circuitry 54 are active, enabled, or turned on. Switch SW1 is open, switch SW2 is open, and switch SW3 is closed. Both first portion 104 and second portion 106 of secondary winding Ls are electromagnetically coupled to primary winding Lp (e.g., secondary winding Ls has an effective length equal to length 108 of FIG. 3) and contribute to the turn ratio and impedance of transformer 94. Capacitors 76 and 78 and the entirety of transformer 94 (e.g., all of primary winding Lp and all of secondary winding Ls) perform impedance matching between gain circuitry 91 and load 56.

In reduced power mode 122 (sometimes also referred to herein as backoff mode 122 or power backoff mode 122), amplifiers 64A and 66A (sometimes also referred to herein as the primary amplifiers of gain circuitry 91) are active, enabled, or turned on. Amplifiers 64B and 66B (sometimes also referred to herein as the secondary amplifiers of gain circuitry 91) are inactive, disabled, or turned off. Switch SW1 is closed, switch SW2 is closed, and switch SW3 is open. First portion 104 and a first segment or subset of second portion 106 (e.g., extending from conductor 98 to terminal 102) are electromagnetically coupled to primary winding Lp (e.g., secondary winding Ls has an effective length equal to length 110 of FIG. 3) and contribute to the turn ratio and impedance of transformer 94. However, the remainder of second portion 106 (e.g., extending from terminal 102 to terminal 100) is not electromagnetically coupled to primary winding Lp and does not contribute to the turn ratio or impedance of transformer 94. Capacitors 76 and 78, capacitors 86 and 84, and a subset of transformer 94 (e.g., all of primary winding Lp but only length 104 of secondary winding Ls) perform impedance matching between gain circuitry 91 and load 56.

Figure 5:
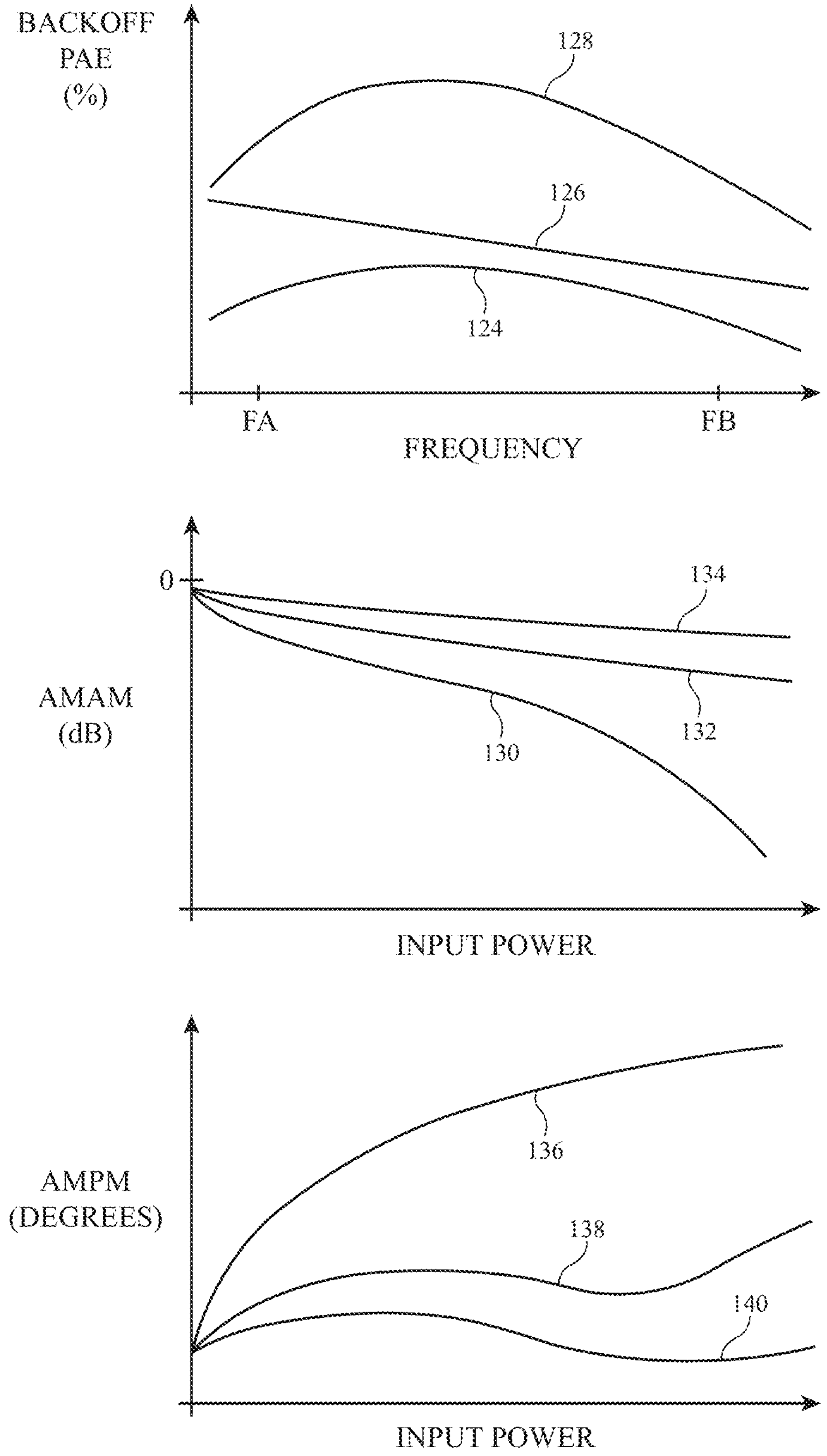
FIGS. 5 and 6 includes plots of operating characteristics for illustrative amplifier circuitry of the type shown in FIG. 3 in accordance with some embodiments.
Figure 6:
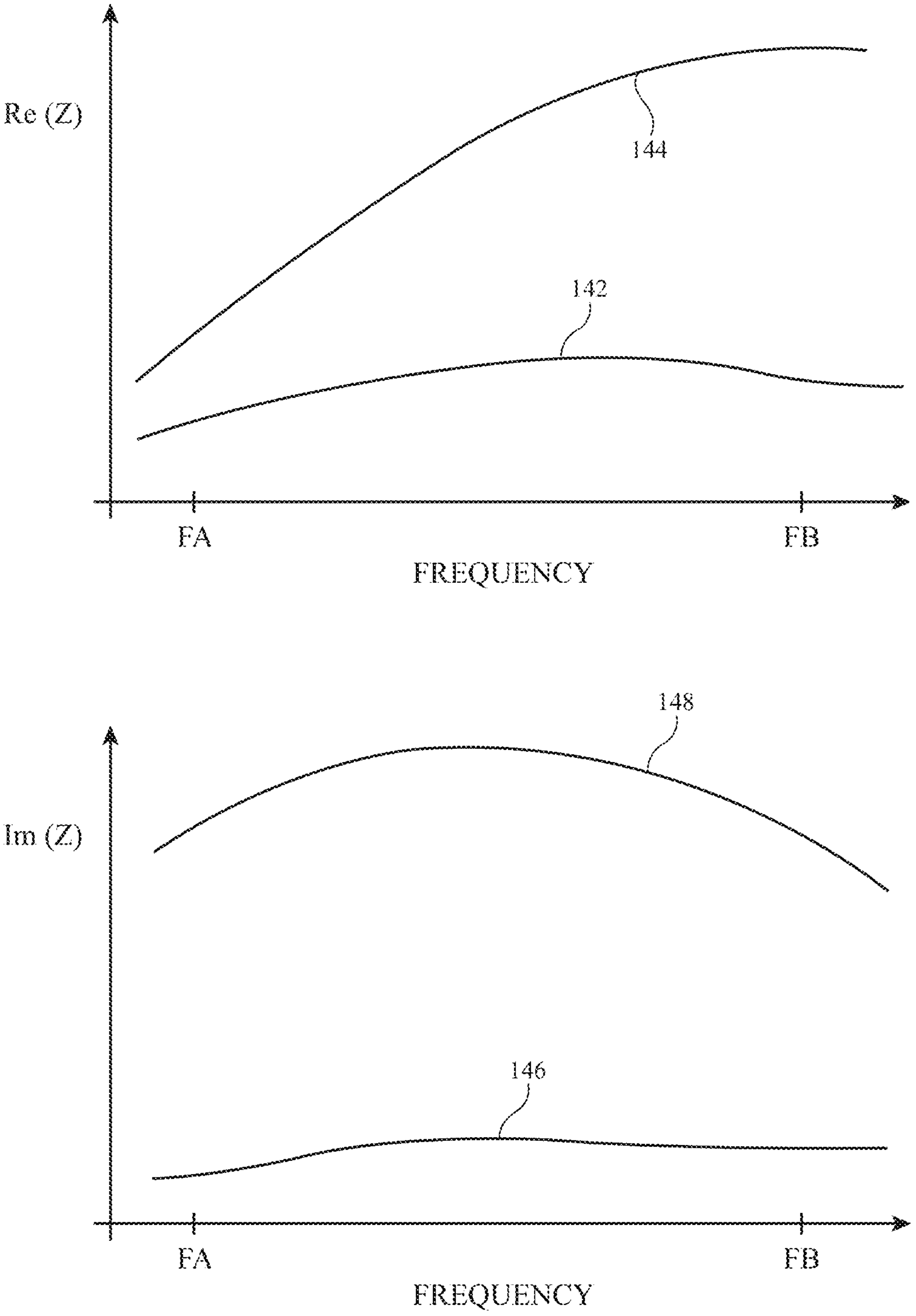

FIGS. 5 and 6 are plots of various operating characteristics for amplifier circuitry 54 while operating in reduced power mode 122 relative to other types of amplifier circuitry operating in power backoff. Curve 126 of FIG. 5 plots PAE as a function of frequency for amplifier circuitry in a first alternate implementation in which the amplifier circuitry is placed in the reduced power mode by turning off all amplifiers 66 on signal line 62N and by coupling node 74 to a termination load. This alternate implementation is also referred to herein as a "one side off" implementation. Curve 124 plots the PAE of amplifier circuitry in a second alternate implementation in which capacitors 86 and 84 and switches SW1-SW3 are omitted from the amplifier circuitry and in which the amplifier circuitry is placed in the reduced power mode only by disabling amplifiers 64B and 66B. This alternate implementation is also referred to herein as a "one unit off" implementation.

Curve 128 plots the PAE of amplifier circuitry 54 of FIG. 3 while operating in reduced power mode 122. As shown by curves 124-128, the adjustment of switches SW1-SW3 may serve to boost the PAE of amplifier circuitry 54 between frequencies FA and FB (e.g., a frequency band of operation of the amplifier circuitry) in power backoff relative to both the one side off implementation and the one unit off implementation.

Curve 134 of FIG. 5 plots the amplitude modulation to amplitude modulation (AMAM) response as a function of input power for amplifier circuitry in the one side off implementation. Curve 130 plots AMAM response for amplifier circuitry in the one unit off implementation. Curve 132 plots the AMAM response for amplifier circuitry 54 of FIG. 3 while operating in reduced power mode 122. As shown by curves 130-134, the adjustment of switches SW1-SW3 may serve to improve the AMAM response of amplifier circuitry 54 relative to the one unit off implementation (e.g., to levels close to the one side off implementation).

Curve 136 of FIG. 5 plots the amplitude modulation to phase modulation (AMPM) response for amplifier circuitry in the one side off implementation. Curve 138 plots the AMPM response for amplifier circuitry in the one unit off implementation. Curve 140 plots the AMPM response for amplifier circuitry 54 of FIG. 3 while operating in reduced power mode 122. As shown by curves 130-134, the adjustment of switches SW1-SW3 may serve to improve the AMPM response of amplifier circuitry 54 relative to both the one side off implementation and the one unit off implementation.

Curve 142 of FIG. 6 plots the real component of the load impedance Z seen by gain circuitry 91 as a function of frequency with only amplifiers 64A and 66A active but prior to closing switches SW1 and SW2 and opening switch SW3. Curve 144 plots the real component of load impedance Z with only amplifiers 64A and 66A active and after closing switch SW1 and opening switches SW2 and SW3.

Curve 146 of FIG. 6 plots the imaginary component of load impedance Z with only amplifiers 64A and 66A active but prior to closing switches SW1 and SW2 and opening switch SW3. Curve 148 plots the imaginary component of load impedance Z with only amplifiers 64A and 66A active and after closing switch SW1 and opening switches SW2 and SW3. As shown by curves 142-148, closing switch SW1 and opening switches SW2 and SW3 may serve to boost both the imaginary and real components of the load impedance Z seen by gain circuitry 91 in reduced power mode 122. The example of FIGS. 5 and 6 is illustrative and non-limiting. Curves 124-148 may have other shapes in practice. Frequencies FA and FB may be any desired frequencies.

Figure 7:
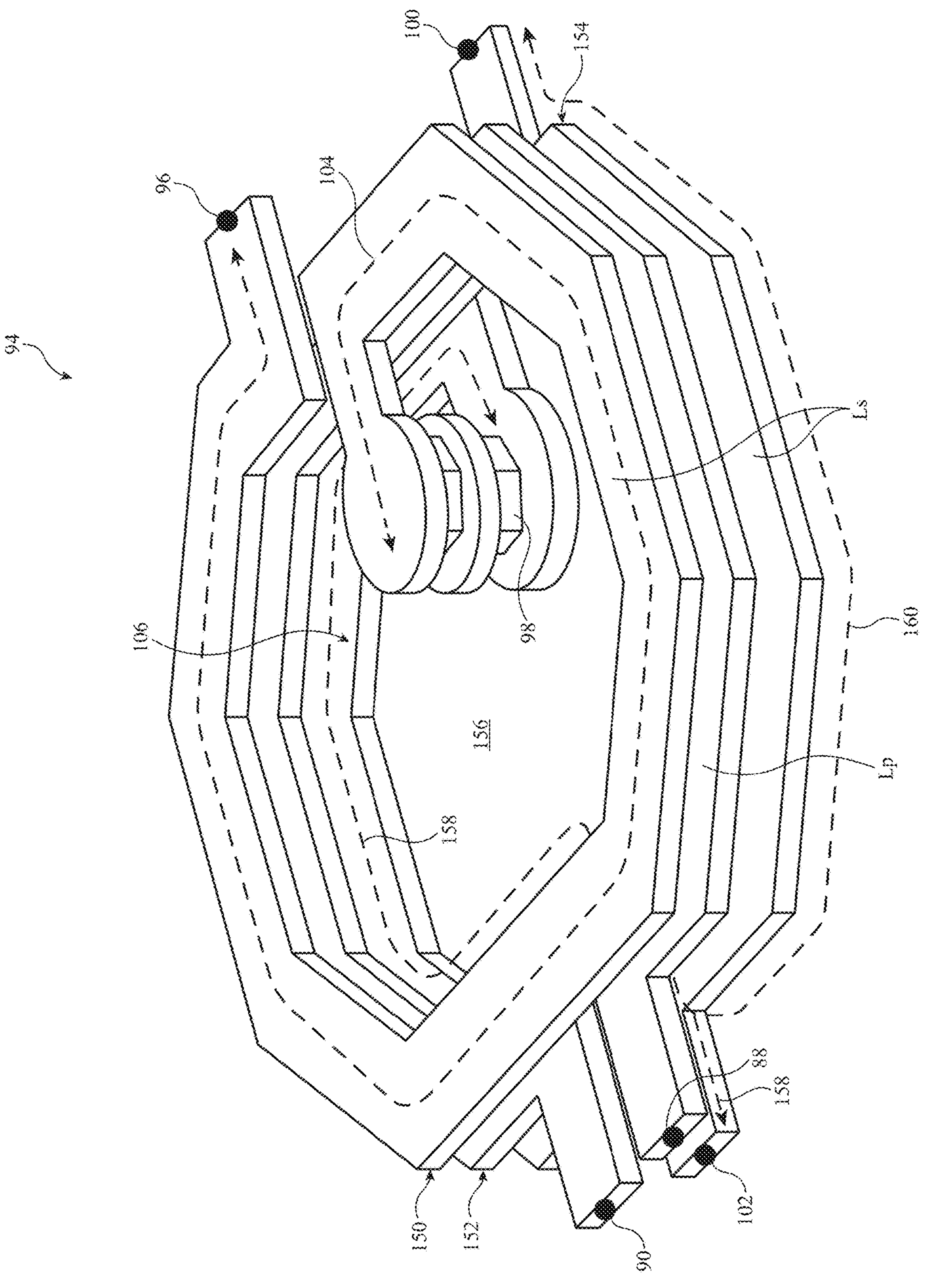
FIG. 7 is a perspective view of an illustrative transformer in reconfigurable matching circuitry of the type shown in FIG. 3 in accordance with some embodiments.

FIG. 7 is a perspective view showing one example implementation for the transformer 94 in output matching circuit 92 (FIG. 3). Transformer 94 may be formed from conductive traces on a substrate such as a semiconductor substrate or a printed circuit board. The substrate has been omitted from FIG. 7 for the sake of clarity. The substrate may include a stack of metallization layers interleaved with insulator or dielectric layers. The metallization layers may include at least a first metallization layer, a second metallization layer under the first metallization layer, and a third metallization layer under the second metallization layer.

As shown in FIG. 7, the primary winding Lp of transformer 94 may include a conductive trace 152 formed from the second metallization layer. Conductive trace 152 may extend from terminal 88 to terminal 90 and may laterally extend, turn, coil, or loop around a central opening such as opening 156. Conductive trace 152 includes only a single turn, coil, or loop around opening 156 in FIG. 7 for the sake of simplicity. If desired, conductive trace 152 may include more than one turn, coil, or loop around opening 156, or may include less than one turn, coil, or loop around opening 156.

The secondary winding Ls of transformer 94 may include a conductive trace 150 formed from the first metallization layer. Conductive trace 150 may extend from terminal 96 to conductor 98 and may laterally extend, turn, coil, or loop around opening 156. If desired, conductive trace 150 may overlap conductive trace 152 (e.g., to minimize the area consumed by transformer 94 on the substrate). Conductive trace 150 includes only a single turn, coil, or loop around opening 156 in FIG. 7 for the sake of simplicity. If desired, conductive trace 150 may include more than one turn, coil, or loop around opening 156, or may include less than one turn, coil, or loop around opening 156.

The secondary winding Ls of transformer 94 may also include a conductive trace 154 formed from the third metallization layer. Conductive trace 154 may extend from conductor 98 and may laterally extend, turn, coil, or loop around opening 156 to terminal 100. If desired, conductive trace 154 may overlap conductive trace 152 and/or conductive trace 150 (e.g., to minimize the area consumed by transformer 94 on the substrate). Conductive trace 154 includes only a single turn, coil, or loop around opening 156 in FIG. 7 for the sake of simplicity. If desired, conductive trace 154 may include more than one turn, coil, or loop around opening 156, or may include less than one turn, coil, or loop around opening 156.

Conductor 98 may be, for example, a conductive through via that extends from the end of conductive trace 150 opposite terminal 96 down to the end of conductive trace 154 opposite terminal 100 (e.g., through insulator layers in the substrate for transformer 94). Conductor 98 may electrically couple the end of conductive trace 150 to the end of conductive trace 154. Terminal 102 may be coupled to a point on conductive trace 154 between conductor 98 and terminal 100. In the example of FIG. 7, terminal 102 is coupled to conductive trace 154 halfway between conductor 98 and terminal 100. This is illustrative and non-limiting. If desired, terminal 102 may be located elsewhere along the length of conductive trace 154 (e.g., to tune how much the turn ratio and the impedance of transformer 94 change when switching between the full power mode and the reduced power mode). Conductive traces 150-154 are sometimes also referred to herein as conductors 150-154.

During signal transmission, current amplified by gain circuitry 91 flows through conductive trace 152 between terminals 90 and 88. This current produces a magnetic field passing into and out of central opening 156. The magnetic field induces corresponding current to flow through conductive trace 150, conductor 98, and at least some of conductive trace 154. Terminal 96 on conductive trace 150 is coupled to output signal path 58 (FIG. 3). Terminal 102 on conductive trace 154 is coupled to switch SW2 (FIG. 3). Terminal 100 on conductive trace 154 is coupled to switch SW3 (FIG. 3). Conductive trace 150 may form the first portion 104 of the secondary winding Ls of transformer 94.

In reduced power mode 122, switch SW3 decouples terminal 100 from ground and switch SW2 shorts terminal 102 on conductive trace 154 to ground. This causes a portion 158 of conductive trace 154 extending from conductor 98 to terminal 102 to electromagnetically couple to conductive trace 152. Current flowing through conductive trace 152 induces current that flows through portion 158 of conductive trace 154, conductor 98, and conductive trace 150. In full power mode 124, switch SW3 shorts terminal 100 to ground and terminal 102 is decoupled from ground by switch SW2. As shown by arrow 160, this extends the amount of conductive trace 154 that electromagnetically couples to conductive trace 152 (e.g., changing the turn ration of transformer 94). Current flowing through conductive trace 152 induces current that flows through all of conductive trace 154, conductor 98, and conductive trace 150.

The example of FIG. 7 is illustrative and non-limiting. If desired, first portion 104 of secondary winding Ls may include conductive traces in two or more metallization layers (e.g., coupled together by conductive vias). If desired, primary winding Lp may include conductive traces in two or more metallization layers. If desired, second portion 106 of secondary winding Ls (FIG. 3) may include conductive traces in two or more metallization layers. Conductive traces 150-154 may each follow any desired path (e.g., having any desired number of straight and/or curved segments) and may have any desired shape (e.g., having any desired number of straight and/or curved edges).

The example of FIGS. 3 and 4 in which gain circuitry 91 includes two amplifiers 64 and two amplifiers 66 and in which amplifier circuitry 64 is switchable between two power modes (i.e., reduced power mode 122 and full power mode 120 of FIG. 4) is illustrative and non-limiting. More generally, gain circuitry 91 may include N amplifiers 64 and N amplifiers 66, where N is any desired integer greater than one. This may configure amplifier circuitry 54 to be switchable between N different power modes (e.g., where the amplifier circuitry has a different maximum output power level in each of the N power modes). The N power modes may include full power mode 120 and N−1 different reduced power modes each associated with a different maximum output power level of amplifier circuitry 54. At the same time, amplifier circuitry 54 may include N switches SW1 that couple capacitors between signal lines 62P and 62N and may include N switches SW2 that couple different terminals 102 on secondary winding Ls to ground (e.g., where different switches SW1 and different switches SW2 are closed in each of the N power modes).

Figure 8:
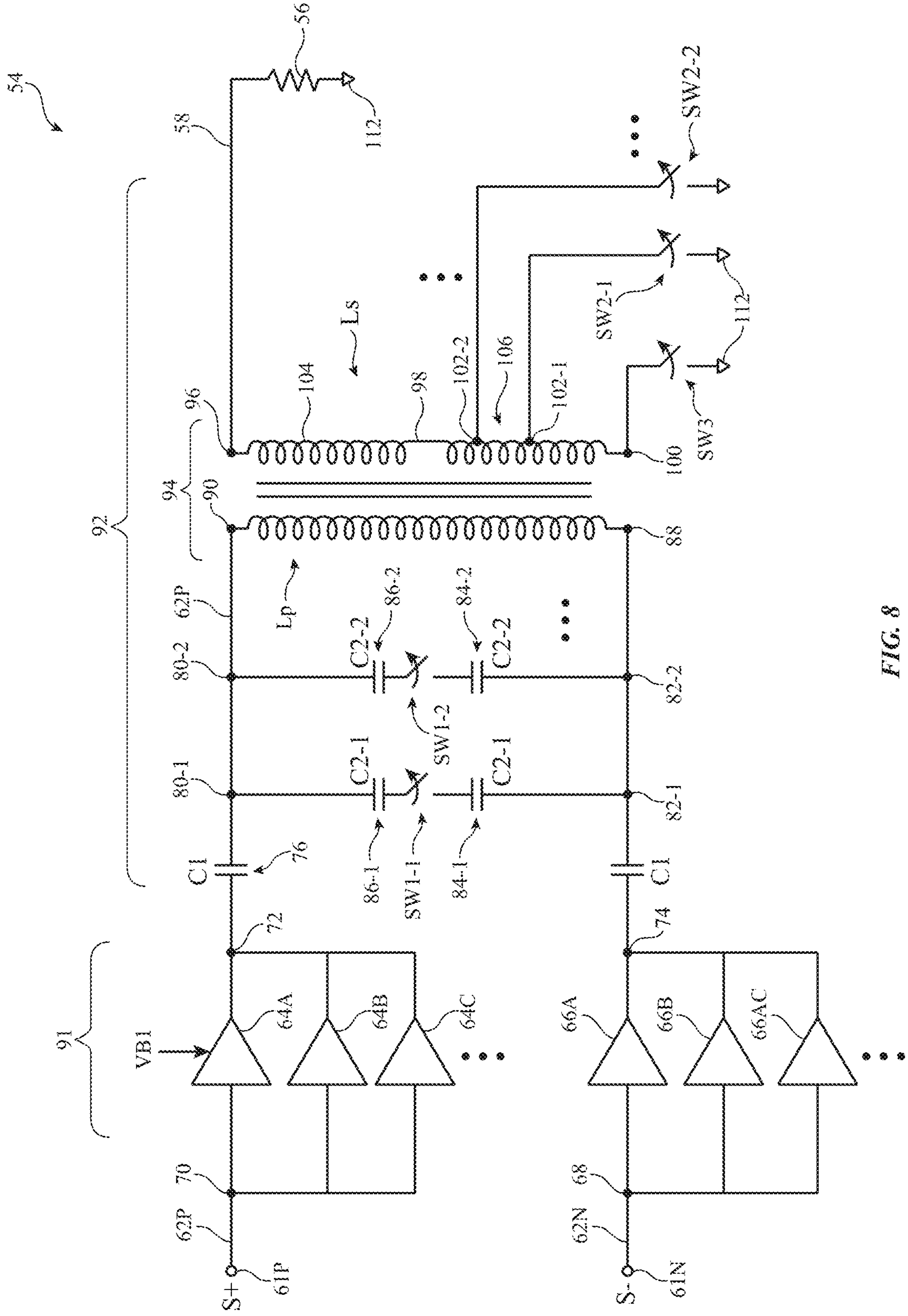
FIG. 8 is a circuit diagram showing how illustrative amplifier circuitry of the type shown in FIG. 3 may be generalized to three or more amplifier units operable in three or more power modes in accordance with some embodiments.

FIG. 8 illustrates another example of amplifier circuitry 54 in which N=3 (e.g., in which amplifier circuitry 54 is switchable between full power mode 122 and first and second reduced power modes). As shown in FIG. 8, gain circuitry 91 may include N=3 amplifiers 64 such as amplifiers 64A, 64B, and 64C coupled in parallel between nodes 70 and 72. Similarly, gain circuitry 91 may include N=3 amplifiers 66 such as amplifiers 66A, 66B, and 66C coupled in parallel between nodes 68 and 74. Output matching circuitry 92 may include N switches SW1 that switchably couple N capacitors 86 and N capacitors 84 between signal lines 62P and 62N.

For example, output matching circuitry 92 may include capacitors 86-1 and 84-1 coupled in series between nodes 80-1 and 82-1 and may include capacitors 86-2 and 84-2 coupled in series between nodes 80-2 and 82-2. Capacitors 86-1 and 84-1 may each have capacitance C2-1. Capacitors 86-2 and 84-2 may each have capacitance C2-2. Output matching circuitry 92 may include a first switch SW1-1 coupled in series between capacitors 86-1 and 84-2 and may include a second switch SW1-2 coupled in series between capacitors 86-2 and 84-2.

Output matching circuitry 92 may also include a first switch SW2-1 coupled between terminal 102-1 on secondary winding Ls and ground 112 and a second switch SW2-2 coupled between terminal 102-2 on secondary winding Ls and ground 112. In full power mode 120, switches SW1-1, SW1-2, SW2-1, and SW2-2 are open, switch SW3 is closed, and all of amplifiers 64A-C and 66A-C are active. This configures transformer 94 to exhibit a first turn ratio and a corresponding first impedance.

In a first reduced power mode, amplifiers 64C and 66C are inactive, amplifiers 64A, 64B, 66A, and 66B are active, switch SW1-1 is closed, switch SW1-2 is open, switch SW2-1 is closed, switch SW3 is open, and switch SW2-2 is open. This configures transformer 94 to exhibit a first turn ratio (e.g., given by the length of secondary winding Ls from terminal 96 to terminal 102-1) and a corresponding second impedance. Capacitors 84-1 and 86-1, primary winding Lp, and the length of secondary winding Ls from terminal 96 to terminal 102-1 perform impedance matching for gain circuitry 91.

In a second reduced power mode, amplifiers 64B, 64C, 66B, and 66C are inactive, amplifiers 64A and 66A are active, switch SW1-1 is open, switch SW1-2 is closed, switch SW2-1 is open, switch SW3 is open, and switch SW2-2 is closed. This configures transformer 94 to exhibit a third turn ratio (e.g., given by the length of secondary winding Ls from terminal 96 to terminal 102-2) and a corresponding third impedance. Capacitors 84-2 and 86-2, primary winding Lp, and the length of secondary winding Ls from terminal 96 to terminal 102-2 perform impedance matching for gain circuitry 91.

This example is illustrative and non-limiting. If desired, amplifiers 64C and 66C may be active and amplifiers 64B and 66B may be inactive in the second reduced power mode. One or more capacitors 86, one or more capacitors 84, and corresponding switches SW1 may be coupled to the secondary winding side of transformer 94 if desired (e.g., nodes 80 may be on output signal path 58 whereas nodes 82 are coupled to terminal 100). Capacitors 84 and 86 may be replaced with inductors and/or networks of capacitive and/or inductive components coupled together in any manner if desired. One or more terminals 102 may be located on first portion 104 of secondary winding Ls if desired. This may be generalized to any desired number N.

As used herein, the term "concurrent" means at least partially overlapping in time. In other words, first and second events are referred to herein as being "concurrent" with each other if at least some of the first event occurs at the same time as at least some of the second event (e.g., if at least some of the first event occurs during, while, or when at least some of the second event occurs). First and second events can be concurrent if the first and second events are simultaneous (e.g., if the entire duration of the first event overlaps the entire duration of the second event in time) but can also be concurrent if the first and second events are non-simultaneous (e.g., if the first event starts before or after the start of the second event, if the first event ends before or after the end of the second event, or if the first and second events are partially non-overlapping in time). As used herein, the term "while" is synonymous with "concurrent."

The methods and operations described above in connection with FIGS. 1-16 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is illustrative and various modifications can be made to the described embodiments. The foregoing embodiments may be implemented individually or in any combination.

What is claimed is:

1. Amplifier circuitry comprising:

a transformer that includes a primary winding and a secondary winding, the secondary winding extending from a first terminal to a second terminal;

first and second amplifiers coupled in parallel between an input port of the amplifier circuitry and the transformer, the amplifier circuitry being operable in a first mode associated with a first maximum output power level and a second mode associated with a second maximum output power level less than the first maximum output power level;

a first switch that couples the second terminal to a reference potential; and a second switch that couples, to the reference potential, a third terminal on the secondary winding, the third terminal being between a center point of the secondary winding and the second terminal, wherein the first switch is closed and the second switch is open while the amplifier circuitry is in the first mode, and the first switch is open and the second switch is closed while the amplifier circuitry is in the second mode.

2. The amplifier circuitry of claim 1, wherein:

the primary winding extends from a fourth terminal to a fifth terminal, the input port is a differential input port that includes a first input terminal and a second input terminal, the amplifier circuitry includes a first signal line that couples the first input terminal to the fourth terminal and includes a second signal line that couples the second input terminal to the fifth terminal, the first amplifier is disposed on the first signal line, and the second amplifier is disposed on the second signal line.

3. The amplifier circuitry of claim 2, further comprising:

a first capacitor coupled between a first node on the first signal line and a second node on the second signal line; and a third switch coupled in series between the first capacitor and the second node on the second signal line.

4. The amplifier circuitry of claim 3, wherein:

the first node is between the first amplifier and the fourth terminal, and the second node is between the second amplifier and the fifth terminal.

5. The amplifier circuitry of claim 4, further comprising:

a second capacitor coupled in series between the third switch and the second node on the second signal line.

6. The amplifier circuitry of claim 5, further comprising:

a third amplifier coupled between the first input terminal and the first node in parallel with the first amplifier; and a fourth amplifier coupled between the second input terminal and the second node in parallel with the second amplifier.

7. The amplifier circuitry of claim 6 wherein, in the first mode, the first, second, third, and fourth amplifiers are active and, in the a second mode, in which the first and second amplifiers are active and the third and fourth amplifiers are inactive.

8. The amplifier circuitry of claim 7, wherein the third switch is open while the amplifier circuitry is in the first mode.

9. The amplifier circuitry of claim 8, wherein the third switch is closed while the amplifier circuitry is in the second mode.

10. The amplifier circuitry of claim 5, further comprising:

a third capacitor coupled in series on the first signal line between the first amplifier and the first node; and a fourth capacitor coupled in series on the second signal line between the second amplifier and the second node.

11. The amplifier circuitry of claim 1, wherein:

the primary winding includes a first conductive trace in a first metallization layer, the secondary winding includes a second conductive trace in a second metallization layer, a third conductive trace in a third metallization layer, and a conductive via that couples the second conductive trace to the third conductive trace, the first, second, and third conductive traces laterally surround an opening, the first conductive trace overlaps the second and third conductive traces, and the first metallization layer is interposed between the second and third metallization layers.

12. The amplifier circuitry of claim 11, wherein the first and second terminals are coupled to the third conductive trace, the first terminal is coupled to an end of the third conductive trace opposite the conductive via, and the second terminal is coupled to the third conductive trace between the end of the third conductive trace and the conductive via.

13. Amplifier circuitry comprising:

a transformer that includes a primary winding and a secondary winding, the secondary winding extending from a first terminal to a second terminal;

first and second amplifiers coupled in parallel between an input port of the amplifier circuitry and the transformer;

a first switch that couples the second terminal to a reference potential;

a second switch that couples, to the reference potential, a third terminal on the secondary winding, the third terminal being between a center point of the secondary winding and the second terminal; and a third switch that couples, to the reference potential, a fourth terminal on the secondary winding, the fourth terminal being between the third terminal and the second terminal.

14. Amplifier circuitry comprising:
a differential signal path that includes a first signal line and a second signal line;
a first amplifier on the first signal line;
a second amplifier on the second signal line;
a transformer having a primary winding extending from a first terminal to a second terminal and having a secondary winding extending from a third terminal to a fourth terminal, the first terminal being coupled to the first signal line and the second terminal being coupled to the second signal line;
a third amplifier coupled between a first input terminal of the amplifier circuitry and the first node in parallel with the first amplifier; and
a fourth amplifier coupled between a second input terminal of the amplifier circuitry and the second node in parallel with the second amplifier.

15. The amplifier circuitry of claim 14, further comprising:
a first capacitor coupled to a first node on the first signal line between the first amplifier and the first terminal; and
a second capacitor coupled to a second node on the second signal line between the second amplifier and the second terminal.

16. The amplifier circuitry of claim 15, further comprising:
a first switch coupled in series between the first and second capacitors.

17. The amplifier circuitry of claim 16, wherein:
the amplifier circuitry is operable in a full power mode and a reduced power mode,
the first, second, third, and fourth amplifiers are active in the full power mode,
the first and second amplifiers are active and the third and fourth amplifiers are inactive in the reduced power mode,
the first switch is open in the full power mode, and
the first switch is closed in the reduced power mode.

18. The amplifier circuitry of claim 13, wherein:
the primary winding includes a first conductive trace in a first metallization layer,
the secondary winding includes a second conductive trace in a second metallization layer, a third conductive trace in a third metallization layer, and a conductive via that couples the second conductive trace to the third conductive trace,
the first, second, and third conductive traces laterally surround an opening,
the first conductive trace overlaps the second and third conductive traces, and
the first metallization layer is interposed between the second and third metallization layers.

19. The amplifier circuitry of claim 13, further comprising:
a third amplifier coupled between the first input terminal and the first node in parallel with the first amplifier; and
a fourth amplifier coupled between the second input terminal and the second node in parallel with the second amplifier.

20. The amplifier circuitry of claim 1, wherein the center point is halfway between the first and second terminals.

* * * * *